United States Patent
Martin et al.

(10) Patent No.: US 9,915,687 B2
(45) Date of Patent: Mar. 13, 2018

(54) REAL CURRENT METER

(71) Applicant: Liebert Corporation, Columbus, OH (US)

(72) Inventors: James K. Martin, Galena, OH (US); Terry D. Bush, Westerville, OH (US); Charles F. Blair, Powell, OH (US)

(73) Assignee: Liebert Corporation, Columbus, OH (US)

(*) Notice: Subject to any disclaimer, the term of this patent is extended or adjusted under 35 U.S.C. 154(b) by 108 days.

(21) Appl. No.: 15/075,535

(22) Filed: Mar. 21, 2016

(65) Prior Publication Data

US 2016/0282390 A1    Sep. 29, 2016

Related U.S. Application Data

(60) Provisional application No. 62/139,252, filed on Mar. 27, 2015.

(51) Int. Cl.
  *G01R 19/06* (2006.01)
  *G01R 19/02* (2006.01)
  *G01R 31/02* (2006.01)

(52) U.S. Cl.
  CPC ............. *G01R 19/06* (2013.01); *G01R 19/02* (2013.01); *G01R 31/025* (2013.01)

(58) Field of Classification Search
  CPC ........ G01R 11/19; G01R 11/40; G01R 29/16; G01R 29/14; G01R 29/18; G01R 19/02; G01R 19/06; H01F 30/12; H01H 71/7445; H02P 2209/05; H02H 3/343
  USPC .................................................. 324/107, 108
  See application file for complete search history.

(56) References Cited

U.S. PATENT DOCUMENTS

| | | | |
|---|---|---|---|
| 4,809,123 A | | 2/1989 | Allington et al. |
| 5,521,482 A | * | 5/1996 | Lang .................... G01R 31/343 318/800 |
| 6,433,458 B2 | | 8/2002 | Nakatsuka et al. |
| 6,794,879 B2 | | 9/2004 | Lawson et al. |
| 7,439,747 B2 | | 10/2008 | Beeman |
| 2002/0140432 A1 | | 10/2002 | Jones |
| 2005/0094344 A1 | * | 5/2005 | Kang ................... G01R 15/183 361/115 |
| 2010/0220422 A1 | | 9/2010 | Jackson |
| 2011/0068802 A1 | * | 3/2011 | Roscoe .................. H02H 3/331 324/509 |
| 2013/0135905 A1 | | 5/2013 | Yeh |
| 2013/0322133 A1 | | 12/2013 | Li |

(Continued)

FOREIGN PATENT DOCUMENTS

CA    2454723 A1    2/2003

OTHER PUBLICATIONS

Notification of Transmittal of the International Search Report and Written Opinion of the International Searching Authority for PCT/US2016/023767 dated Jun. 15, 2016.

*Primary Examiner* — Tung X Nguyen
*Assistant Examiner* — Robert P Alejnikov, Jr.
(74) *Attorney, Agent, or Firm* — Harness, Dickey & Pierce, P.L.C.

(57) ABSTRACT

A real current meter reads current from a current probe coupled around power lines of a transformer-based UPS system coupled to a transformer having a high resistance ground with a HRG resistance and determines a real current component of the current read from the current probe.

6 Claims, 4 Drawing Sheets

(56) References Cited

U.S. PATENT DOCUMENTS

2014/0176164 A1* 6/2014 Davis ................... A46B 9/028
 324/709
2014/0177289 A1   6/2014 Chen et al.

* cited by examiner

REAL CURRENT METER

CROSS-REFERENCE TO RELATED APPLICATIONS

This application claims the benefit of U.S. Provisional Application No. 62/139,252, filed on Mar. 27, 2015. The entire disclosure of the above application is incorporated herein by reference.

FIELD

The present disclosure relates to meters used in diagnosing faults in uninterruptible power supply systems.

BACKGROUND

This section provides background information related to the present disclosure which is not necessarily prior art.

In transformer-based uninterruptible power supply systems (UPS systems) such as UPS system 100 (FIG. 1) having a rectifier input 101 coupled to an input transformer 102 with a Y secondary 104, the Y secondary 104 often has a high resistance ground connection, often referred to as an HRG. That is, as shown in FIG. 1, Y secondary has an HRG 106 with a resistance referred to herein as HRG resistance 108 connected between the common connection 110 of the Y secondary 104 and actual ground. The hot phases Y-1, Y-2, Y-3 of Y secondary 104 are coupled to a rectifier input 101 of UPS system 100 and provide the AC power input to UPS system 100.

When there is no ground fault in the UPS system 100, the 3 phase currents in power lines 112, 114, 116 from the three hot phases Y-1, Y-2, Y-3 of Y secondary 104 will sum to zero. Thus, a current probe 118 coupled around power lines 112, 114, 116 will see zero current.

When there is a ground fault, shown as ground fault 120 in FIG. 1, on one of power lines 112, 114 or 116, the current flowing through the HRG resistance 108 is measured as part of the process of diagnosing the short. In the example shown in FIG. 1, a meter 122 is coupled to current probe 118 to read the current sensed by current probe 118. When current probe 118, which is coupled around power lines 112, 114, 116, is located between Y-secondary 104 and ground fault 120, current probe 118 will see only the HRG current (as the three phase currents sum to zero) which will be read by meter 122 which for example displays the current it reads. When current probe 118 is located between ground fault 120 and UPS system 100, current probe 118 does not see the HRG current and thus the current read by meter 122 from current probe 118 will be zero.

To locate ground fault 120, current probe 118 is positioned at different locations along power lines 112, 114, 116 typically by starting adjacent Y-secondary 104 and moving current probe 118 along power lines 112, 114, 116 until the current seen by current probe 118 goes to zero. This occurs when current probe 118 is moved across power lines 112, 114, 116 where ground fault 120 has occurred. It should be understood that current probe 118 could be moved along power lines 112, 114, 116 in the opposite direction and the location of ground fault 120 then identified when the current seen by current probe 118 goes from zero to the HRG current. In some cases, the resistance value of the HRG resistance 108 can be switched making it easier to locate the fault as the meter readings change as the HRG resistance value changes and the changing meter readings are more noticeable.

The foregoing is also applicable to a transformer-based UPS system having an inverter output coupled to a Y-primary of an output transformer which has an HRG. It should be understood that the UPS system have both an n input transformer an output transformer having a Y-primary, with the input of the rectifier of the UPS system coupled to the Y-secondary of the input transformer and the output of the inverter of the UPS system coupled to the Y-secondary of the output transformer, with both the input transformer and the output transformer having an HRG. The hot phases of the Y-secondary of the input transformer and of the Y-primary of the output transformer will be referred to generically herein as phases $\phi_a$, $\phi_b$, $\phi_c$. The voltage on phase $\phi_b$ lags the voltage on phase $\phi_a$ by 120 degrees and the voltage on phase $\phi_c$ lags the voltage on phase $\phi_a$ a by 240 degrees.

The foregoing discussion assumed that there is only real current flowing in phases $\phi_a$, $\phi_b$, $\phi_c$. In modern UPS systems, this is not the case as the capacitors in the switched circuits of the UPS systems, the EMI capacitors in particular of the EMI filters of the UPS systems, have an appreciable amount of reactive current flowing through them, typically referred to as charging current.

Consequently, current probe 118 will also see this non-zero charging current in the power lines for phases $\phi_a$, $\phi_b$, $\phi_c$ which will then be read by meter 122. As a result, while current probe 118 will see a change in the amount of current as it is moved across the location of ground fault 120, this change will not be between zero and the amount of the HRG current. Rather, the change will be between the charging current and the sum of the charging current and the HRG current.

SUMMARY

This section provides a general summary of the disclosure, and is not a comprehensive disclosure of its full scope or all of its features.

In accordance with an aspect of the present disclosure, a real current meter reads current from a current probe coupled around power lines of a transformer-based UPS system coupled to a transformer having a high resistance ground with a HRG resistance and determines a real current component of the current read from the current probe.

In an aspect, the real current meter has a current sensor coupled to a controller, the current sensor couplable to a current probe that is couplable around three phases of power lines of the uninterruptible power supply system, the three phases being phases $\phi_a$, $\phi_b$, $\phi_c$ with an AC voltage on phase $\phi_b$ lagging an AC voltage on phase $\phi_a$ by 120 degrees and an AC voltage on phase $\phi_c$ lagging the AC voltage on phase $\phi_a$ by 240 degrees. The real current meter has a voltage sensor coupled to the controller, the voltage sensor couplable across two phases of the input power lines. The controller is configured to determine a real current component of current sensed via the current sensor when the current probe is coupled around the three phases of the power lines and one of the phases is experiencing a ground fault and the voltage sensor is coupled to two phases of the power lines by: determining a resultant angle based on time elapsed between a zero cross time of an RMS current sum sensed via the current sensor and a zero cross time of a voltage across the phases of the input lines to which the voltage sensor is coupled; setting a fault angle to the resultant angle when the resultant angle is between zero and ninety degrees, setting the fault angle to the resultant angle decremented by one-hundred twenty degrees when decrementing the resultant angle by one-hundred twenty degrees results in an angle between zero and ninety degrees and setting the fault angle to the result angle decremented by two-hundred forty degrees when decrementing the resultant angle by two-hundred forty degrees results in an angle between zero and ninety degrees and determining the real current component of the RMS current sum by multiplying the RMS current sum by a cosine of the set fault angle. The controller is also configured to display on a display the determined real current component of the RMS current sum.

In an aspect, the controller is configured to determine the resultant angle by converting the time elapsed between the zero cross time of the RMS current sum and the zero cross time of a voltage across the phases of the input lines to which the voltage sensor is coupled to an angle and adding thirty degrees to this angle.

In an aspect, when the voltage sensor is coupled across phase $\phi_a$ and phase $\phi_b$, the controller is configured to determine that the ground fault is on phase $\phi_a$ when the resultant angle is between zero and ninety degrees, configured to determine that the ground fault is on phase $\phi_b$ when the resultant angle is between 120 degrees and 210 degrees and configured to determine that the ground fault is on phase $\phi_c$ when the resultant angle is between 240 degrees and 330 degrees.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
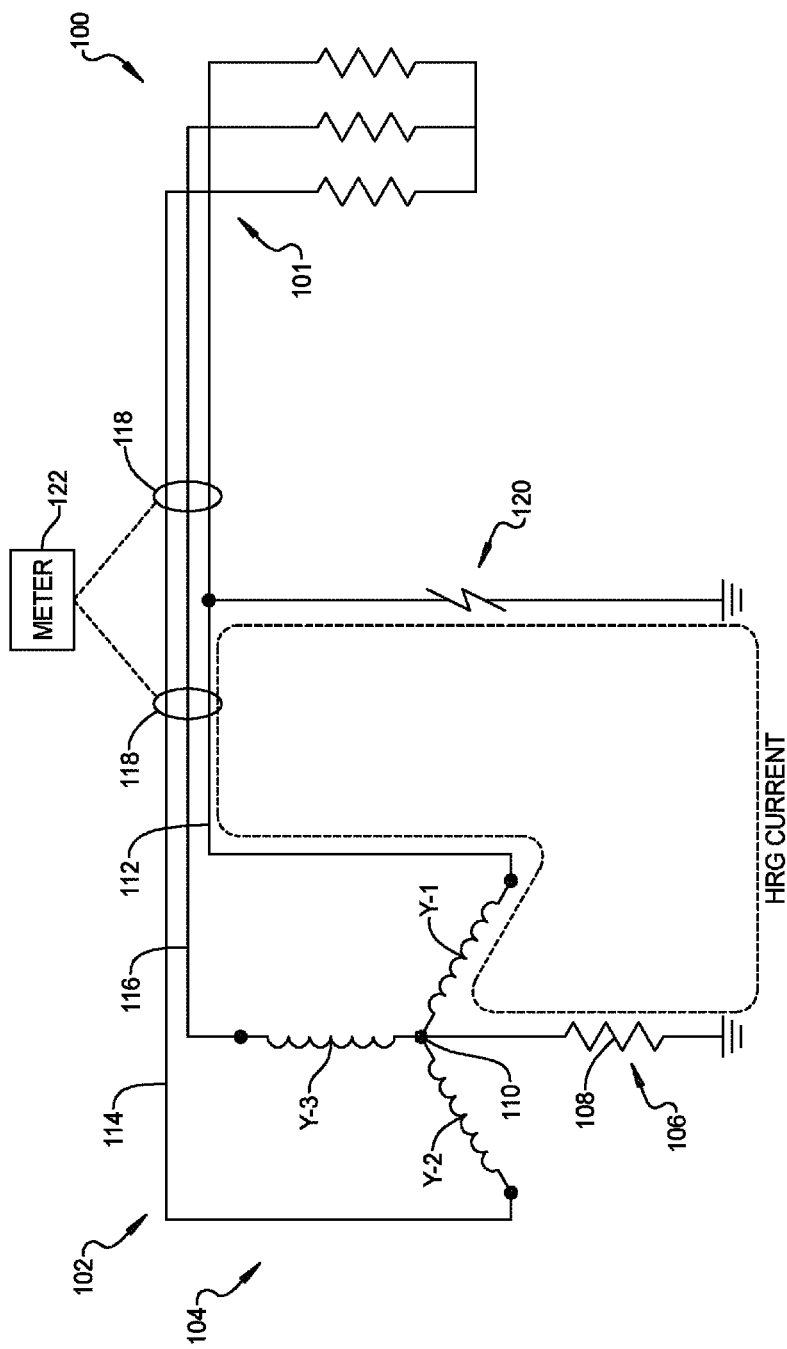
FIG. 1 is a simplified schematic of a prior art UPS system.

Example embodiments will now be described more fully with reference to the accompanying drawings. Corresponding reference numerals indicate corresponding parts throughout the several views of the drawings.

Figure 2:
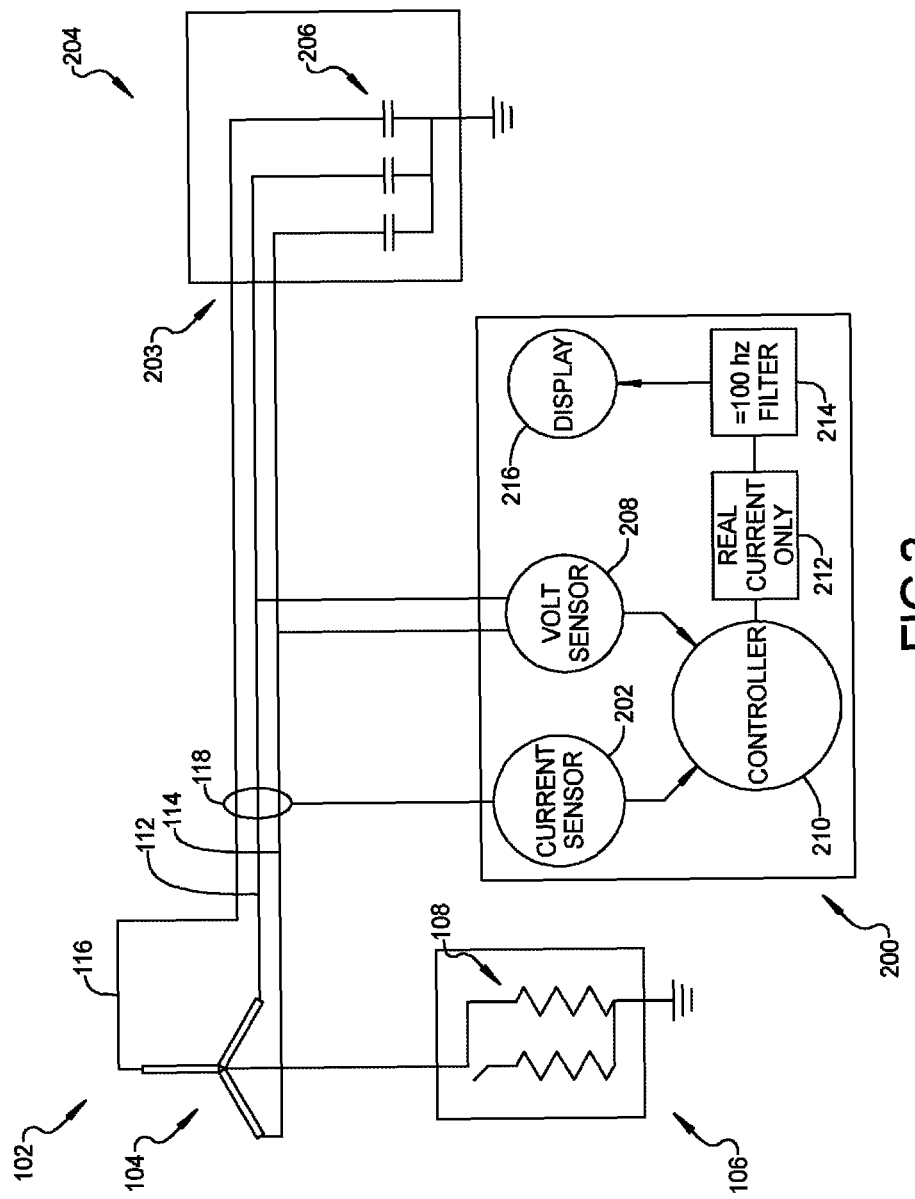
FIG. 2 is a simplified schematic showing a real current meter in accordance with an aspect of the present disclosure coupled to power lines between a Y-secondary of an input transformer having a HRG resistance and a rectifier input of a prior art UPS system.

FIG. 2 shows a real current meter 200 in accordance with an aspect of the present disclosure having a current sensor 202 coupled to current probe 118 that is coupled around input power lines 112, 114, 116 (phases $\phi_a$, $\phi_b$ $\phi_c$) from Y-secondary 104 of input transformer 102 to a rectifier input 203 of UPS system 204. UPS system 204 is shown illustratively with EMI filtering capacitors 206 as representative of capacitors in the switched circuits of UPS system 204 associated with rectifier input 203 of UPS system 204. Real current meter 200 also includes a voltage sensor 208 coupled to two of $\phi_a$, $\phi_b$ $\phi_c$ of input power lines 112, 114, 116 and a controller 210 that determines real current based on readings from current probe 118 and voltage sensor 208, as discussed in more detail below. Current sensor 202 and voltage sensor 208 are coupled to controller 210. The real current determined by controller 210, shown representatively by box 212, is optionally filtered by low pass filter 214 and the filtered real current output to display 216 where a value of the real current is displayed. It should be understood that optional low pass filter 214 could be implemented in controller 210, in software for example, and controller 210 then drives display 216 to display the value of the real current.

Figure 3:
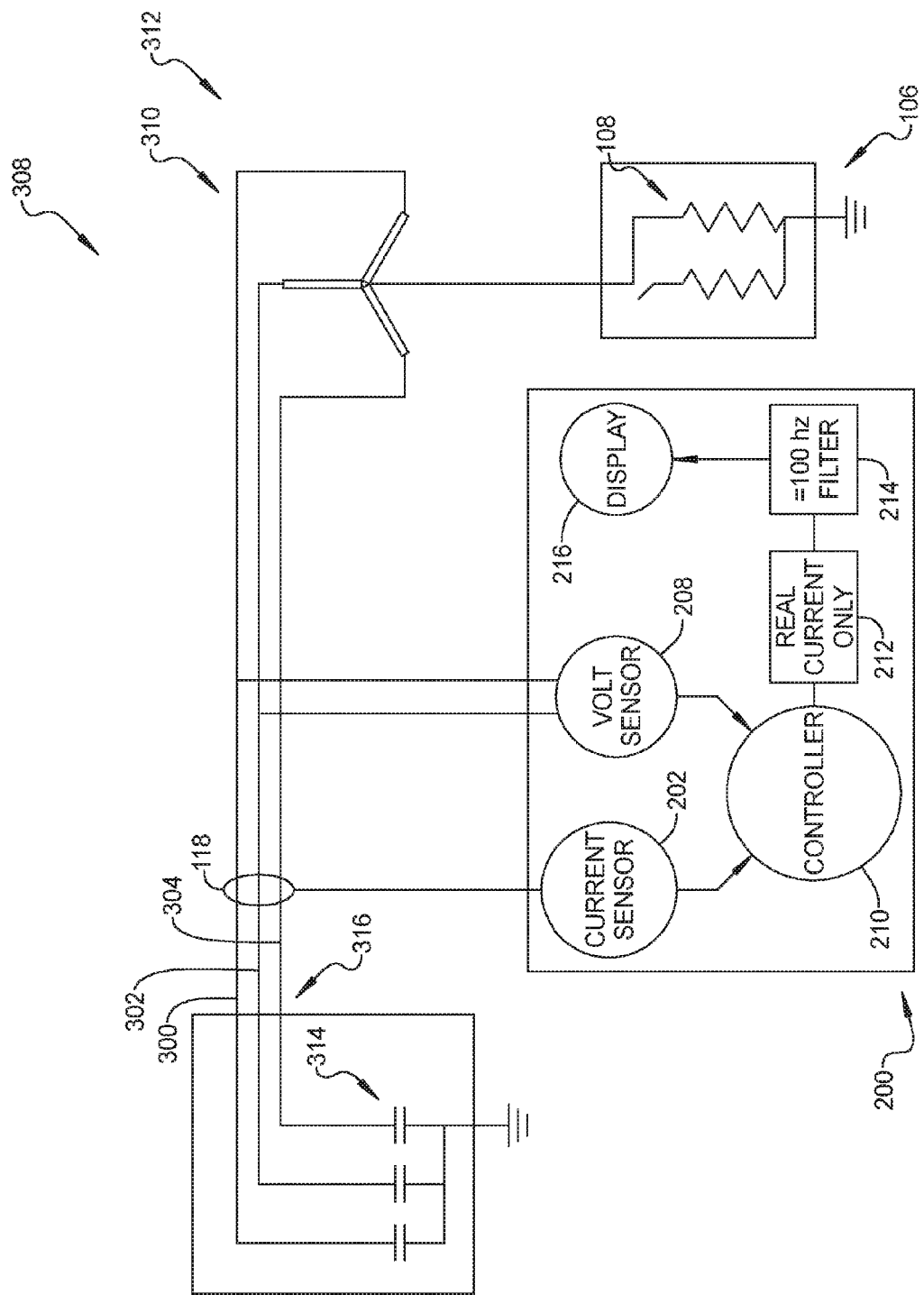
FIG. 3 is a simplified schematic showing the real current meter of FIG. 2 coupled to power lines between an inverter output of a prior art UPS system and a Y-primary of an output transformer having an HRG resistance.

FIG. 3 shows real current meter 200 having current sensor 202 coupled to current probe 118 that is coupled around output power lines 300, 302, 304 (phases $\phi_a$, $\phi_b$ $\phi_c$ respectively) from an inverter output 316 of a UPS system 308 to a Y-primary 310 of an output transformer 312. UPS system 308 is shown illustratively with EMI filtering capacitors 314 as representative of capacitors in the switched circuits of UPS system 308 associated with inverter output 316 of UPS system 308.

The following methodology is illustratively used in determining HRG current. HRG current is the result of current flowing through the HRG resistor when a ground fault occurs and will be in phase with the voltage of the phase on which the ground fault is present, referred to herein as the faulted phase. The charging current is the result of reactive current flowing through the EMI capacitors and will lead the faulted phase voltage by ninety degrees. The net sum of these two currents (HRG current plus charging current) will flow at some angle between zero and ninety degrees in relation to the faulted phase voltage. The angle will depend on the relative amplitudes of the HRG current and the charging current. It should be understood that the HRG current is real current and thus the real current component of the net sum of these two current components.

If the RMS current sum ($I_{sum}$) is measured (which is the net sum of the HRG current and charging current) and the angle between it and the faulted voltage phase determined, referred to herein as the fault angle, then the HRG current and the charging current can each be derived. This is done by multiplying the RMS current sum by the cosine of this fault angle to get the HRG current and by multiplying the RMS current sum by the sine of this fault angle to get the charging current. The charging current is thus separated from the RMS current sum to get the desired HRG current.

The fault angle between the RMS current sum and the faulted phase voltage ($V_a$, $V_b$ or $V_c$) is determined in accordance with the following. The time elapsed between $I_{sum}$ zero cross time and the zero cross time of the voltage across phases $\phi_a$, $\phi_b$ ($V_{ab}$) is measured. This time is converted to an angle by multiplying it by the frequency of the system (50 or 60 Hz) and then multiplying the result by 360 degrees. Since the voltage of phase $\phi_a$ to neutral ($V_{an}$) lags $V_{ab}$ by thirty degrees, thirty degrees is added to this angle with the summed angle referred to as the resultant angle. If this resultant angle is between zero and ninety degrees, the fault is on $\phi_a$, and the fault angle is this resultant angle. If not, this resultant angle is reduced in steps of 120 degree decrements until the decremented angle is between zero and ninety degrees. If one decrement of 120 degrees results in the decremented angle being between zero and ninety degrees, the ground fault is on $\phi_b$ and the fault angle is the resultant angle decremented by 120 degrees. If two decrements of 120 degrees result in the decremented angle being between zero and ninety degrees, the ground fault is on $\phi_c$ and the fault angle is the resultant angle decremented by 240 degrees.

Figure 4:
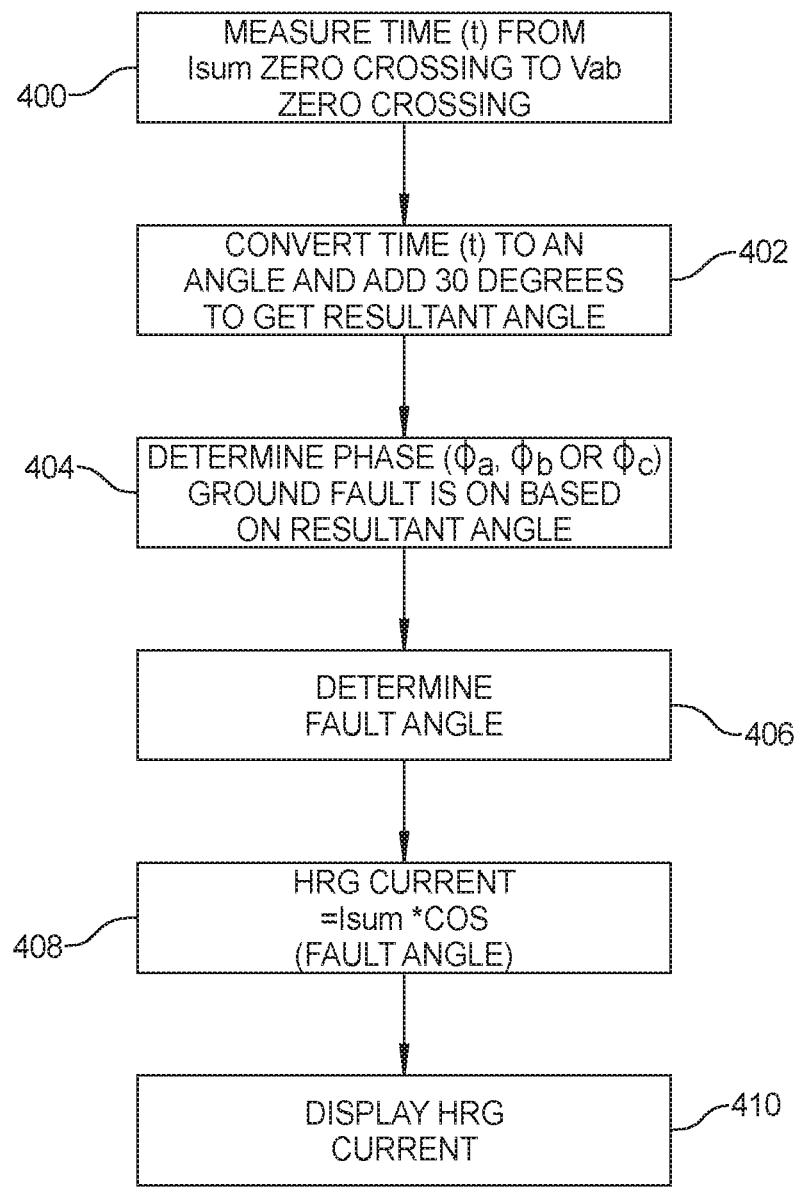
FIG. 4 is a flow chart of a control routine used in the real current meter of FIGS. 2 and 3 to determine HRG current.

FIG. 4 is a flow chart of an illustrative routine implemented in controller 210, such as in software or firmware programmed in controller 210, of the above methodology by which controller 210 determines the HRG current based on the current sensed by current sensor 202 from current probe 118 and the voltage sensed by voltage sensor 208. As discussed above, current probe 118 is coupled around the power lines for all three phases, such as power lines 112, 114, 116 in FIG. 2 or power lines 300, 302, 304 in FIG. 3. Current sensor 202 senses the RMS sum, referred to as $I_{sum}$ as discussed above. Voltage sensor 208 is coupled across two of the three phases, phases $\phi_a$ and $\phi_b$ in the following discussion, and senses the voltage across these two phases, referred to as $V_{ab}$ as discussed above. At 400, the time from $I_{sum}$ zero crossing to $V_{ab}$ zero crossing is measured, illustratively by controller 210. At 402, the measured time is converted to an angle, illustratively by controller 210, in the manner discussed above, and thirty degrees is added to this angle with this summed angle referred to as the resultant angle also as discussed above. At 404, it is determined which phase ($\phi_a$, $\phi_b$, or $\phi_c$) the ground fault is on based on the resultant angle, this determination illustratively being made by controller 210. In accordance with the above discussed methodology, if the resultant angle is between zero and ninety degrees, the ground fault is on phase $\phi_a$, if the resultant angle is between 120 degrees and 210 degrees, the ground fault is on phase $\phi_b$ and if the resultant angle is between 240 degrees and 330 degrees, the ground fault is on phase $\phi_c$. At 406, the fault angle is determined, illustratively by controller 210. In accordance with the above discussed methodology, if the resultant angle is between zero and ninety degrees, the fault angle is set equal to the resultant angle. If the resultant angle is between 120 degrees and 210 degrees, the fault angle is set equal to the resultant angle minus 120 degrees. If the resultant angle is between 240 degrees and 330 degrees, the fault angle is set equal to the resultant angle minus 240 degrees. It should be understood that since the current in any phase cannot lead the voltage in that phase by more than ninety degrees, the resultant angle can never be between ninety degrees and 120 degrees, between 210 degrees and 240 degrees, or between 330 degrees and zero degrees.

At 408, a value of HRG current is determined by multiplying $I_{sum}$ by the cosine of the fault angle, illustratively by controller 210, which is real current and equal to a real current component of $I_{sum}$. At 410, the determined value of HRG current is output by controller 210, such as to display 216. The determined value of HRG current may optionally be filtered by optional low pass filter 214 to remove any higher frequency signals from the current measurement that may result from the PWM switching of the rectifier and/or inverter of the UPS system.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A real current meter, comprising:
a current sensor coupled to a controller, the current sensor couplable to a current probe that is couplable around three phases of power lines of a transformer-based uninterruptible power supply system, the three phases being phase $\phi_a$, phase $\phi_b$ which lags phase $\phi_a$ by 120 degrees and phase $\phi_c$ which lags phase $\phi_a$ by 240 degrees;
a voltage sensor coupled to the controller, the voltage sensor couplable across two of the phases;
the controller configured to determine a real current component of current sensed via the current sensor when the current probe is coupled around the three phases and one of the phases is experiencing a ground fault and the voltage sensor is coupled across the two phases by:
 determining a resultant angle based on time elapsed between a zero cross time of an RMS current sum sensed via the current sensor and a zero cross time of a voltage across the phases to which the voltage sensor is coupled;
 setting a fault angle to the resultant angle when the resultant angle is between zero and ninety degrees, setting the fault angle to the resultant angle decremented by one-hundred twenty degrees when decrementing the resultant angle by one-hundred twenty degrees results in an angle between zero and ninety degrees and setting the fault angle to the result angle decremented by two-hundred forty degrees when decrementing the resultant angle by two-hundred forty degrees results in an angle between zero and ninety degrees;
 determining the real current component of the RMS current sum by multiplying the RMS current sum by a cosine of the set fault angle; and
the controller configured to display on a display the determined real current component of the RMS current sum.

2. The real current meter of claim 1 wherein the controller is configured to determine the resultant angle by converting the time elapsed between the zero cross time of the RMS current sum and the zero cross time of the voltage across the phases to which the voltage sensor is coupled to an angle and adding thirty degrees to this angle.

3. The real current meter of claim 2 wherein when the voltage sensor is coupled across phase $\phi_a$ and $\phi_b$, the controller is configured to determine that the ground fault is on phase $\phi_a$ when the resultant angle is between zero and ninety degrees, configured to determine that the ground fault is on phase $\phi_b$ when the resultant angle is between 120 degrees and 210 degrees and configured to determine that the ground fault is on phase $\phi_c$ when the resultant angle is between 240 degrees and 330 degrees.

4. A method of measuring a real current component of an RMS current sum of current flowing in three phases of power lines for a three phase transformer-based uninterruptible power supply system having a transformer having a high resistance ground connection wherein one of the three phases is experiencing a ground fault, the three phases being phase $\phi_a$, phase $\phi_b$ which lags phase $\phi_a$ by 120 degrees and phase $\phi_c$ which lags phase $\phi_a$ by 240 degrees, the uninterruptible power supply system having switched circuits that include capacitors, the method comprising:
placing a current probe coupled to a current sensor of a real current meter around the three phases;
coupling a voltage sensor of the real current meter across phase $\phi_a$ and phase $\phi_b$;

with a controller of the real current meter:
  determining a resultant angle based on time elapsed between a zero cross time of the RMS current sum sensed via the current sensor and a zero cross time of a voltage across the phases a and b and with the controller;
  setting a fault angle to the resultant angle when the resultant angle is between zero and ninety degrees;
  setting the fault angle to the resultant angle decremented by one-hundred twenty degrees when decrementing the resultant angle by one-hundred twenty degrees results in an angle between zero and ninety degrees; and
  setting the fault angle to the resultant angle decremented by two-hundred forty degrees when decrementing the resultant angle by two-hundred forty degrees results in an angle between zero and ninety degrees;
  determining the real current component of the RMS current sum by multiplying the RMS current sum by a cosine of the set fault angle; and
  displaying on a display of the real current meter the determined real current component of the RMS current sum.

5. The method of claim 4 wherein determining the resultant angle with the controller includes having the controller determine the resultant angle by converting the time elapsed between the zero cross time of the RMS current sum and the zero cross time of the voltage across the phases to which the voltage sensor is coupled to an angle and adding thirty degrees to this angle.

6. The method of claim 5 including determining with the controller which of the phases the ground fault is on by determining that the ground fault is on phase $\phi_a$ when the resultant angle is between zero and ninety degrees, determining that the ground fault is on phase $\phi_b$ when the resultant angle is between 120 degrees and 210 degrees and determining that the ground fault is on phase $\phi_c$ when the resultant angle is between 240 degrees and 330 degrees.

* * * * *